United States Patent
Gautama

(10) Patent No.: US 9,432,761 B2
(45) Date of Patent: Aug. 30, 2016

(54) SIGNAL PROCESSOR

(71) Applicant: NXP B.V., Eindhoven (NL)

(72) Inventor: Temujin Gautama, Leuven (BE)

(73) Assignee: NXP B.V., Eindhoven (NL)

( * ) Notice: Subject to any disclaimer, the term of this patent is extended or adjusted under 35 U.S.C. 154(b) by 79 days.

(21) Appl. No.: 14/509,129

(22) Filed: Oct. 8, 2014

(65) Prior Publication Data
US 2016/0105742 A1    Apr. 14, 2016

(51) Int. Cl.
| | |
|---|---|
| H03G 5/00 | (2006.01) |
| H04R 3/00 | (2006.01) |
| H04R 1/22 | (2006.01) |
| H04R 3/14 | (2006.01) |
| H03G 3/20 | (2006.01) |
| H04R 3/04 | (2006.01) |

(52) U.S. Cl.
CPC .................. *H04R 1/22* (2013.01); *H03G 3/20* (2013.01); *H04R 3/14* (2013.01); *H04R 3/04* (2013.01)

(58) Field of Classification Search
None
See application file for complete search history.

(56) References Cited

U.S. PATENT DOCUMENTS

| | | | |
|---|---|---|---|
| 4,583,245 A | 4/1986 | Gelow et al. | |
| 7,372,966 B2 | 5/2008 | Bright | |
| 8,363,852 B2 | 1/2013 | Bharitkar et al. | |
| 2007/0003075 A1 | 1/2007 | Cooper et al. | |
| 2012/0121098 A1 | 5/2012 | Gautama | |
| 2012/0195447 A1* | 8/2012 | Hiruma | H04S 7/303 381/306 |
| 2013/0305152 A1 | 11/2013 | Griffiths et al. | |

FOREIGN PATENT DOCUMENTS

| | | |
|---|---|---|
| WO | WO-2010/122441 A1 | 10/2010 |
| WO | WO-2011/085148 A1 | 7/2011 |

OTHER PUBLICATIONS

Leach, Jr., W. Marshall; "A Generalized Active Equalizer for Closed-Box Loudspeaker Systems"; J. Audio Eng. Soc., vol. 38, No. 3; pp. 142-146 (Mar. 1990).
Bright, Andrew; "Tracking Changes in Linear Loudspeaker Parameters with Current Feedback"; Audio Engineering Society, Convention Paper 5909; New York, NY, USA; 11 pages (Oct. 2003).
Extended European Search Report for Patent Appln. No. 15188796.5 (Mar. 10, 2016).

* cited by examiner

*Primary Examiner* — Thang Tran

(57) ABSTRACT

One example discloses a signal processor, including: a signal input having an input bandwidth; a first transducer output; a second transducer output; a filter network coupled to the signal input, the first transducer output and the second transducer output; wherein the filter network is configured to output a first portion of the input bandwidth on the first transducer output and a second portion of the input bandwidth on the second transducer output; and a control module coupled to the filter network and configured to adjust the first and second portions of the input bandwidth in response to signal degradation on the first transducer output.

18 Claims, 5 Drawing Sheets

SIGNAL PROCESSOR

Various example embodiments of systems, methods, apparatuses, devices, articles of manufacture and computer readable mediums for signal processing are now discussed.

Audio reproduction is one form of signal processing, whereby the fidelity of an audio speaker's sound is quite noticeable. To obtain audio reproduction across the complete audio frequency band (e.g., from 20 Hz to 20 kHz), a loudspeaker system, having a main loudspeaker and a subwoofer to reproduce the very low frequencies (say, below 80 Hz or 100 Hz), may be used. The audio signal can be fed into a cross-over filter network that outputs high-pass filtered signals for the main loudspeakers and a low-pass filtered signal for the subwoofer. The cross-over frequency can be set manually, or it can be optimized in an iterative process with user feedback, or automatically based on optimization criteria.

To improve robustness and low frequency response, loudspeaker equalization can be used. One objective of loudspeaker equalization is to 'equalize' the acoustical transfer function of a loudspeaker such that a target transfer function is obtained (with, e.g., a lower cut-off frequency of the acoustical transfer function of the loudspeaker). The target (desired) transfer function is factorized into a product of the acoustical transfer function of the loudspeaker (or a model thereof) and an equalization filter. A system consisting of a cascade of the equalization filter and the loudspeaker makes up the transfer function. The equalization operation consists of pre-filtering the audio signal with an equalization filter, before sending it to the loudspeaker. Such an approach can be used to extend an acoustical response of a loudspeaker towards the lower frequencies. For example, the target transfer function will be that of a high-pass filter with a target cut-off (resonance) frequency and a target Q-factor.

The equalization filter can be computed based on the acoustical transfer function of a loudspeaker model. The equalization filter can thereby follow changes in the loudspeaker characteristics. Indeed, the resonance frequency and Q-factor of a loudspeaker can change under the influence of external factors, such as ambient temperature and humidity, and as a result of ageing. Therefore, it is beneficial to continuously adjust the equalization filter on the basis of estimates of these loudspeaker parameters. These parameter changes are reflected in the electrical impedance function of the loudspeaker, and can be monitored on the basis of the voltage across and the current flowing into the loudspeaker voice coil.

Mechanical loudspeaker protection in one example includes pre-processing an audio signal in such a way that the resulting loudspeaker diaphragm displacement does not exceed a certain limit, thereby preventing signal distortion or safe-guarding loudspeaker life-time. Various approaches may rely on prediction or measurement of loudspeaker diaphragm displacement. Such mechanical loudspeaker protection however can reduce the low frequency response of loudspeakers and thereby degrade the audio quality.

SUMMARY

In one example embodiment, a system for audio system loudspeaker protection is provided which reduces distortion during audio signal reproduction. When the audio system includes a main speaker and a subwoofer, such distortion effects can be reduced or eliminated by adaptively controlling the audio signal cross-over frequency between the main speaker and the subwoofer. This is achieved by controlling the low frequency response of the loudspeaker and adaptively adjusting the cross-over filter network of the audio system, which determines what portion of the signal is sent respectively, to the main speakers and to the subwoofer. In another example embodiment, signal equalization is also controlled in such a way that amplifier and digital clipping is avoided.

In another example embodiment a signal processor, comprises: a signal input having an input bandwidth; a first transducer output; a second transducer output; a filter network coupled to the signal input, the first transducer output and the second transducer output; wherein the filter network is configured to output a first portion of the input bandwidth on the first transducer output and a second portion of the input bandwidth on the second transducer output; and a control module coupled to the filter network and configured to adjust the first and second portions of the input bandwidth in response to signal degradation on the first transducer output.

In another example embodiment, wherein signal degradation on the first transducer output is based on a first transducer stress limit.

In another example embodiment, further comprising an amplifier, having an amplifier limit, coupled to the first transducer output; and wherein signal degradation on the first transducer output is based on the amplifier limit.

In another example embodiment, further comprising a DAC, having a DAC headroom limit, coupled to the first transducer output; and wherein signal degradation on the first transducer output is based on the DAC headroom limit.

In another example embodiment, wherein the first transducer output is a high audio frequency band speaker output and the second transducer output is a low audio frequency band speaker output; and wherein the control module is configured to decrease or increase the first portion of the input bandwidth and increase or decrease the second portion of the input bandwidth based on the signal degradation.

In another example embodiment, further comprising an equalizer configuring a first transducer target resonance frequency for the first transducer output; and wherein the control module is configured to increase the first target resonance frequency in response to the signal degradation.

In another example embodiment, wherein the equalizer configures a second transducer target resonance frequency for the second transducer output; further comprising a second control module coupled to the filter network; and wherein the second control module is configured to increase the second target resonance frequency in response to the signal degradation on the second transducer output.

In another example embodiment, wherein the signal processor is included in at least one of: a smartphone, an audio system, an active loudspeaker, a media device, a transportation device, a stereo, a radio or a transducer protection device.

In another example embodiment, further comprising a first transducer coupled to the first transducer output and a second transducer coupled to the second transducer output; and wherein the transducers are at least one of: a bandwidth limited device, a main loudspeaker, a subwoofer, a woofer, a tweeter, a piezo speaker.

In another example embodiment, wherein the filter network includes a high-pass filter configured to output the first portion of the input bandwidth and a low-pass filter configured to output the second portion of the input bandwidth; wherein the first and second portions of the input bandwidth are separated by a cross-over frequency; and wherein the control module is configured to adjust the cross-over frequency.

In another example embodiment, wherein the signal input is an audio signal input.

In another example embodiment, an article of manufacture comprises at least one non-transitory, tangible machine readable storage medium containing executable machine instructions for signal processing, the instructions comprising: outputting a first portion of an input bandwidth on a first transducer output and a second portion of the input bandwidth on a second transducer output; and adjusting the first and second portions of the input bandwidth in response to signal degradation on the first or second transducer output.

In another example embodiment, the instructions further comprising: detecting signal degradation on the first or second transducer output based on a first transducer stress limit.

In another example embodiment, the instructions further comprising: detecting signal degradation on the first or second transducer output based on an amplifier limit.

In another example embodiment, the instructions further comprising: detecting signal degradation on the first or second transducer output based on a DAC headroom limit.

In another example embodiment, increasing a first transducer target resonance frequency for the first transducer output in response to the signal degradation.

In another example embodiment, wherein an interface between the first and second portions of the input bandwidth is a cross-over frequency; wherein adjusting further includes: reducing the cross-over frequency until the cross-over frequency reaches a minimum cross-over frequency, or until signal degradation on the first transducer output is detected; and increasing the cross-over frequency until signal degradation on the first transducer output is not detected; whereby the cross-over frequency converges to a nominal frequency.

In another example embodiment, further comprising, adjusting a first transducer output target resonance frequency in response to signal degradation on the first transducer output; wherein adjusting includes: reducing the target resonance frequency until the target resonance frequency reaches a minimum target resonance frequency, or until signal degradation on the first transducer output is detected; and increasing the target resonance frequency until signal degradation on the first transducer output is not detected; whereby the target resonance frequency converges to a nominal frequency.

In another example embodiment, a method for signal processing, comprising: outputting a first portion of an input bandwidth on a first transducer output and a second portion of the input bandwidth on a second transducer output; and adjusting the first and second portions of the input bandwidth in response to signal degradation on the first transducer output.

In another example embodiment, further comprising: a set of N transducer outputs; wherein the signal input is configured to receive a set of channels; wherein the filter network is coupled to the set of N transducer outputs; wherein the filter network is configured to apportion the input bandwidth and set of channels between the set of N transducer outputs; and wherein the control module is configured to adjust the portions in response to signal degradation on a subset of the N transducer outputs.

Various example embodiments can be used in (home or automotive) audio systems that include a separate subwoofer, where loudspeaker protection is required. Example embodiments can also be used to protect against amplifier clipping (which can be due to loudspeaker equalization), and to optimize the (automotive or home) audio system accordingly.

The above discussion is not intended to represent every example embodiment or every implementation within the scope of the current or future Claim sets. The Figures and Detailed Description that follow also exemplify various example embodiments.

These example embodiments may be more completely understood in consideration of the following Detailed Description in connection with the accompanying Drawings, in which:

Figure 1:
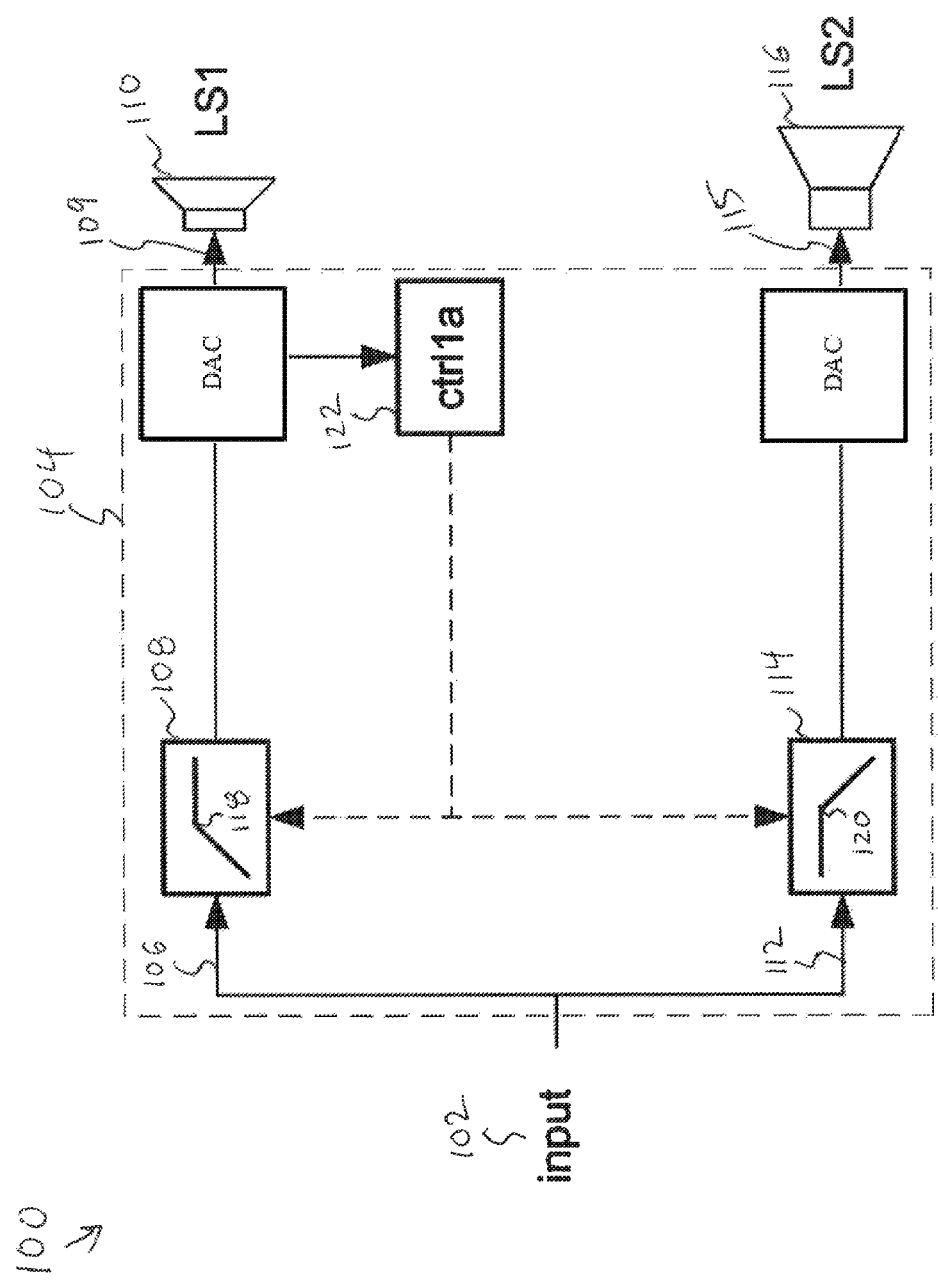
FIG. 1 is a first example embodiment of a signal processor.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

FIG. 1 is a first example embodiment of a signal processor 100. An analog or digital signal input 102, having an input signal bandwidth, is received by a filter network 104. In an example embodiment the signal input 102 receives an audio input signal. In an example embodiment the filter network 104 is a cross-over filter network. An upper branch 106 of the filter network 104 consists of a high-pass filter and feeds a first transducer 110 from a first transducer output 109. The lower branch 112 of the filter network 104 consists of a low-pass filter which feeds a second transducer 116 from a second transducer output 115.

In one example the first transducer 110 is a main loudspeaker (LS1), such as a mid-range loudspeaker, which receives the higher audio frequency band, and the second transducer 116 is a subwoofer loudspeaker (LS2), which receives the lower audio frequency band; however, in other example embodiments the transducers 110, 116 can be another output devices such as a woofer, a tweeter, a piezo speaker.

If the signal input 102 is a multi-channel (e.g. stereo) audio signal, then an additional module (not shown) in the second branch converts the signal input 102 to mono before it is sent to the low-pass filter. Both the upper and lower branches can also include a DAC (Digital to Analog Converter), an amplifier (not shown) and an equalizer in their signal paths.

The high-pass and low-pass filters within the cross-over filter network have corner frequencies 118, 120 that in one example are related to each other in a fixed or dynamic manner. In one example embodiment the corner frequencies 118, 120 are the same. In another example embodiment, the corner frequencies 118, 120 differ by a prescribed ratio. In one example embodiment, both corner frequencies are described as a single parameter from which both corner frequencies can be uniquely derived. This parameter will be referred to as the cross-over frequency.

A first control module ("ctrl1$a$") 122 monitors a voltage and/or current sent to the first transducer 110 and, using a first transducer model, predicts the transducer stress level (e.g. mechanical limits, diaphragm displacement limits, thermal limits, current or voltage load limits, etc.) of the first transducer 110 (e.g. whether LS1 is close to its mechanical or other limit).

Algorithmic models can be used to predict the loudspeaker system's acoustical response (from the voltage-to-acoustical-output transfer function). Loudspeaker model parameters can be obtained from the measurement of the electrical impedance function of the loudspeaker, either once in a calibration phase, or they can be tracked continuously. For a loudspeaker in a sealed enclosure, e.g., the acoustical output can be approximated by a second-order high-pass filter. The corner (resonance) frequency of this high-pass behavior is, among others, inversely related to the volume of the sealed enclosure and, as a consequence, a loudspeaker will be less efficient in reproducing low frequencies if it is mounted in a smaller enclosure.

In one example, a feed forward displacement predictor is used in combination with a predefined diaphragm displacement limit. In a feed-forward approach, audio processing is performed on an output (e.g. audio) signal sent to the first transducer 110 (e.g. the loudspeaker) and is adapted on a basis of a predicted stress on the transducer 110 (e.g. loudspeaker displacement), in response to the output signal based on a fixed or adaptive transducer 110 (e.g. loudspeaker) model.

Alternatively, other mechanisms can be used to prevent the mechanical stress, such as a Low Frequency Shelving and Notch Filter (LFSN). The LFSN changes the transfer function of the combination of the LFSN filter and the loudspeaker into a second-order high-pass filter with a target Q-factor and target resonance frequency.

If the first control module 122 determines or uses an estimate indicating that the stress limit of the first transducer 110 is about to or is being exceeded, then the first control module 122 increases the cross-over frequency of the filter network 104. The cross-over frequency is increased by increasing the corner frequencies 118, 120 of both the high-pass filter 108 and the low-pass filter 114. If the first control module 122 determines that the stress limit of the first transducer 110 is not close to being exceeded, then the first control module 122 decreases the cross-over frequency or adapts it back towards an original or pre-set cross-over frequency value.

If the predicted stress limit is exceeded, the cross-over frequency of the filter network 104 is increased. This way, a broader range of low signal input 102 frequencies will be reproduced by transducer 116 if the transducer 110 would be operating near or beyond its limits if the cross-over frequencies would remain unchanged.

While the physical resonance frequency of each transducer 110, 116 (e.g. speaker) is fixed for a given mechanical configuration, equalizers can shift the transducers' 110, 116 target resonance frequencies. During such loudspeaker equalization, the frequency range of the first transducer 110 (e.g. loudspeaker LS1) may be extended towards the lower frequencies. However, as the first transducer's 110 low frequency response is boosted, not only can the transducer's 110 mechanical stress limits be exceeded, but also upper branch 106 amplifier and/or DAC clipping may occur.

Thus, the first control module ("ctrl1$a$") 122 monitors amplifier headroom and DAC headroom in the upper branch 106 to determine if either or both of the headroom levels have been exceeded and the signal in the upper branch 109 is clipping. As the acoustical response of a loudspeaker is extended towards the lower frequencies for loudspeaker equalization, the signal after equalization may have a larger amplitude than before equalization. When this signal exceeds a maximum operational amplifier power level or maximum DAC coding level, then signal input 102 clipping occurs and the signal input 102 is degraded. If the first control module 122 determines that amplifier or DAC headroom is about to be exceeded, the first control module 122 increases the cross-over frequency of the filter network 104.

While only two transducers 110, 116 are discussed in FIG. 1, the principles of re-allocating input signal bandwidth and adjusting target resonance frequencies can be applied to embodiments having N-transducers, where N is an integer. Such other transducers include: mid-woofers, tweeters, other subwoofers, and other main speakers.

In various example embodiments the signal processor is included in at least one of: a smartphone, an audio system, an active loudspeaker, a media device, a transportation device, a stereo, a radio or a transducer protection device.

Figure 2:
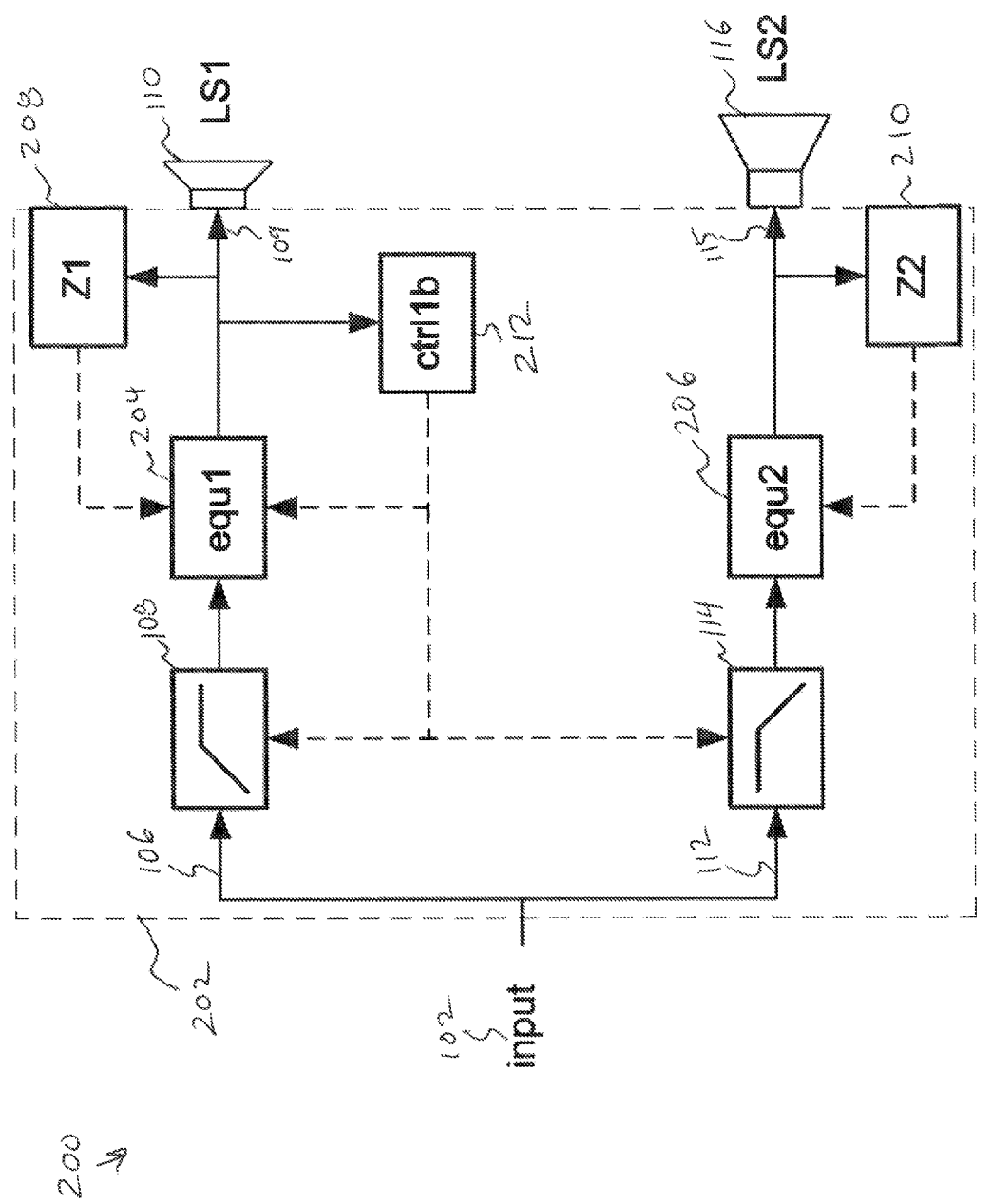
FIG. 2 is a second example embodiment of a signal processor.

FIG. 2 is a second example embodiment of a signal processor 200. In the second example, both the first transducer 110 (e.g. main loudspeaker LS1) and the second transducer 116 (e.g. subwoofer LS2) are equalized, using equ1 204 and equ2 206, such that the transfer functions correspond to desired transfer functions, e.g., having second-order high-pass transfer functions with desired resonance frequencies and Q-factors. Such loudspeaker equalization may improve the low frequency response of the first transducer 110 (e.g. main loudspeaker LS1) and of the second transducer 116 (e.g. subwoofer LS2).

Equalization filter (equ1) 204 is adjusted on the basis of the first transducer's 110 model parameters. Equalization filter (equ2) 206 is adjusted on the basis of the second transducer's 116 (e.g. subwoofer's) model parameters. In one example, the transducer 110, 116 model parameters are determined in a calibration phase.

In another example, the first transducer's 110 model parameters are tracked continuously by a module Z1 208 which monitors an electrical impedance of the first transducer 110. The second transducer's 116 model parameters are tracked continuously by module Z2 210 which monitors an electrical impedance of the second transducer 116. The modules' parameters are determined based on circuits sensing the voltage across and current flowing into the loudspeakers. In this example embodiment these electrical impedances include acoustical impedances of the first and second transducers 110 and 116.

In an alternate embodiment, the impedance modules Z1 208 and Z2 210 can measure the acoustical transfer functions of the transducers 110, 116, which are in this example a main and subwoofer loudspeakers, using a microphone electrically coupled to the modules Z1 208 and Z2 210.

In different example embodiments, the high-pass filter 108 can be combined with the equalization filter (equ1) 204, but they have been shown as separate blocks for the sake of clarity.

Control module ctrl1$b$ 212 adjusts the effective cross-over frequency of the high-pass 108 and low-pass 114 filters depending on the first transducer's 110 stress (e.g. mechanical, thermal or other) and the upper branch 106 path's amplifier headroom. The ctrl1*b* 212 increases the cross-over frequency, such that the low frequencies (e.g. those that usually cause most of the loudspeaker diaphragm displacement) are attenuated.

When the amplitude of the first transducer output 109 signal, after loudspeaker equalization, is too large (i.e. beyond the upper branch's 106 amplifier headroom), the ctrl1*b* 212 increases the crossover frequency, and in another example embodiment commands equ1 204 to reflect this change (e.g. by adapting the target resonance frequency to the same frequency as the crossover frequency) Note: this part, changing equ1, is described in [0040]. As a result of the higher crossover frequency, less signal power is sent to the first transducer 110 (e.g. LS1), and as a consequence, the amplitude of the first transducer output 109 signal will decrease, thereby reducing the risk of amplifier clipping.

The cross-over frequency can slowly converge to a nominal value otherwise. This convergence or settling occurs based on a ctrlb 212 routine which incrementally (e.g. in 10 Hz steps for a loudspeaker) reduces the cross-over frequency until either the cross-over frequency reaches a minimum cross-over frequency, or until transducer 110 stress, amplifier clipping, or DAC clipping cause ctrlb 212 to increase the cross-over frequency. After ctrlb 212 determines that the transducer 110 is no longer stressed and/or that the danger of amplifier or DAC clipping has subsided, the ctrlb 212 then lets the cross-over frequency incrementally drift back down to a lower cross-over frequency, bounded by the minimum cross-over frequency.

In an alternate example embodiment, the control module ctrl1*b* 212 adjusts both the cross-over frequency and a target resonance frequency of equ1 204 depending on the first transducer's 110 stress and the upper branch 106 path's amplifier headroom. When the first transducer 110 is operating too near or beyond its stress limit, the target resonance frequency of equ1 204 is increased. When the amplitude of the first transducer output 109 signal after equalization is too large, the target resonance frequency of equ1 204 can be increased. The target resonance frequency of equ1 204 can slowly converge to a nominal value otherwise.

This convergence or settling occurs based on a ctrlb 212 routine which incrementally (e.g. in 10 Hz steps for a loudspeaker) reduces the first transducer's 110 target resonance frequency until either the target resonance frequency reaches a minimum target resonance frequency, or until transducer 110 stress, amplifier clipping, or DAC clipping cause ctrlb 212 to increase the target resonance frequency. After ctrlb 212 determines that the transducer 110 is no longer stressed and/or that the danger of amplifier or DAC clipping has subsided, the ctrlb 212 then lets the target resonance frequency incrementally drift back down to a lower target resonance frequency, bounded by the minimum target resonance frequency.

Figure 3:
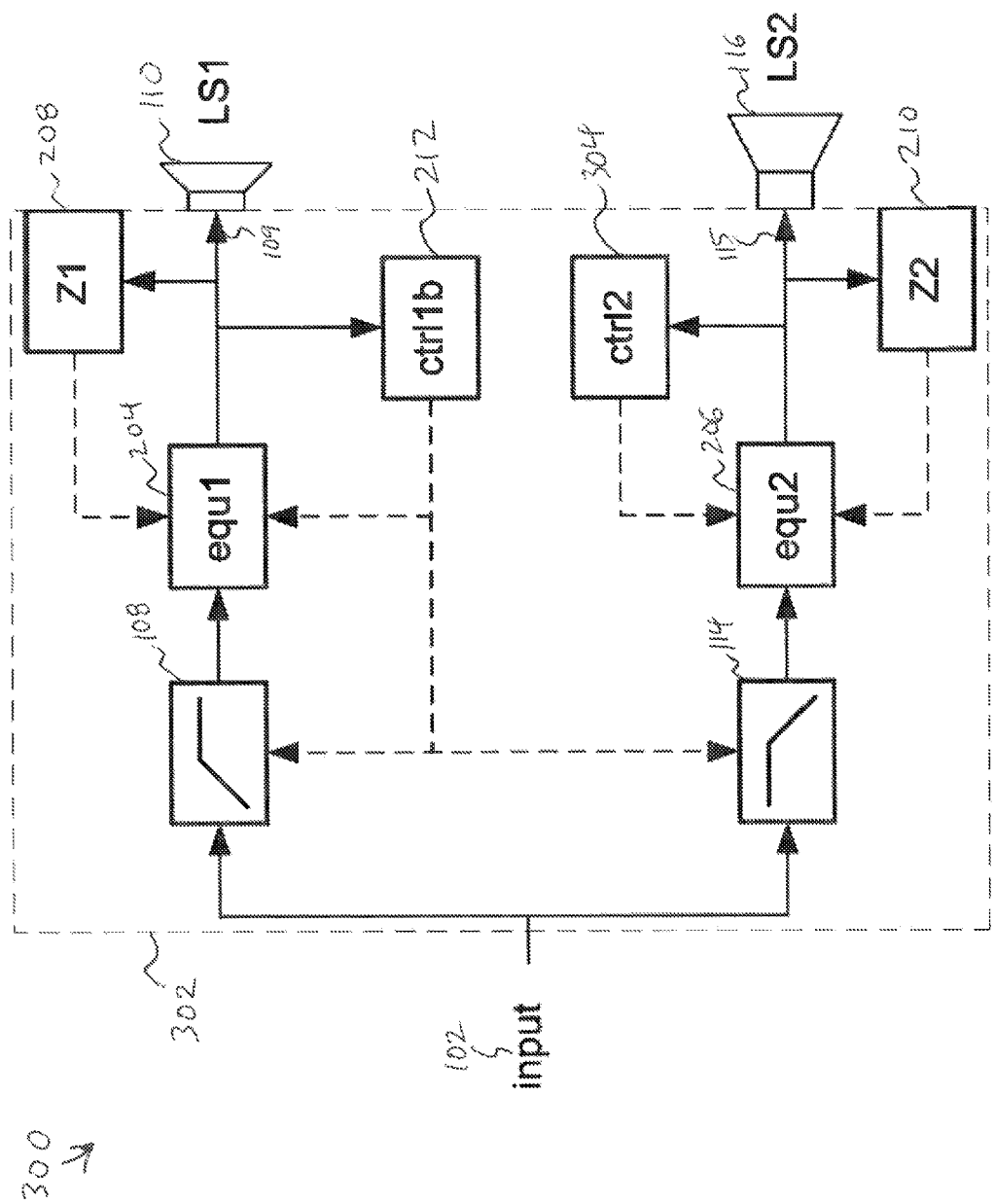
FIG. 3 is a third example embodiment of a signal processor.

FIG. 3 is a third example embodiment of a signal processor 300. If the equalization filter equ2 206 has been set such that the low frequency range of the subwoofer has been extended, an amplitude of the second transducer output 115 signal sent to the second transducer 116 (e.g. subwoofer (LS2)) can be considerably larger than without the equalization filter 206. Furthermore, boosting the low frequencies in response to ctrl1*b* 212 commands may result in more mechanical and thermal stress of the second transducer 116 (e.g. subwoofer (LS2)) due to the resulting higher diaphragm displacement.

Control module ctrl2 304 adjusts a target resonance frequency of the second equalization filter equ2 206 depending on the transducer stress and amplifier headroom of the second transducer 116 (LS2). When the second transducer 116 (e.g. subwoofer (LS2)) is operating too near or beyond its transducer limit, ctrl2 304 increases the target resonance frequency of equ2 206. If the amplitude of the second transducer output 115 signal after loudspeaker equalization is too large, ctrl2 304 can further increase the target resonance frequency of equ2 206.

The target resonance frequency of equ2 206 can slowly converge to a nominal value otherwise, in a manner similar to that described with reference to FIG. 2.

Figure 4:
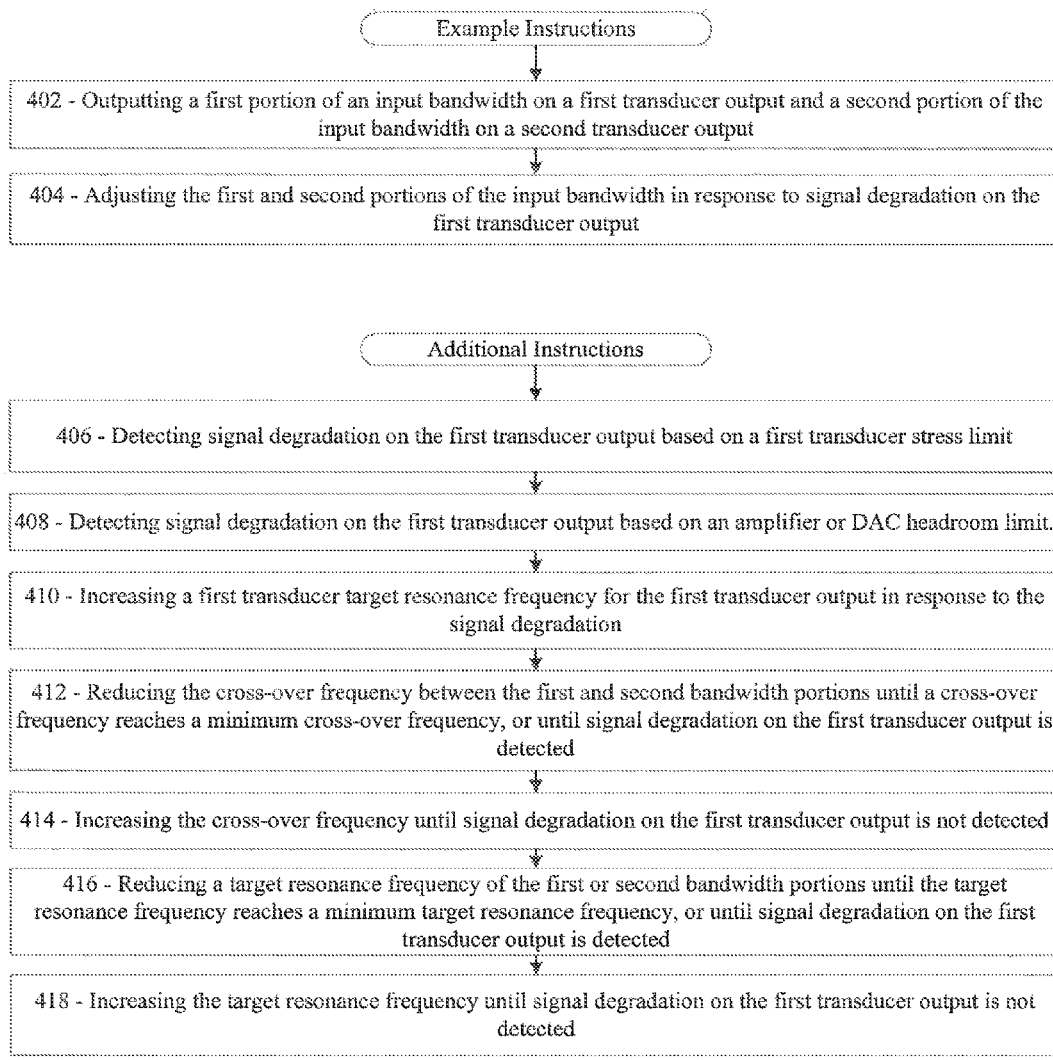
FIG. 4 is an example list of instructions for signal processing.

FIG. 4 is an example list of instructions for signal processing. The order in which the instructions are discussed does not limit the order in which other example embodiments implement the instructions. Additionally, in some embodiments the instructions are implemented concurrently.

A first example instruction set begins in 402, by outputting a first portion of an input bandwidth on a first transducer output and a second portion of the input bandwidth on a second transducer output. Next, in 404, adjusting the first and second portions of the input bandwidth in response to signal degradation on the first transducer output.

The instructions can be augmented with one or more of the following additional instructions, presented in no particular order.

The additional instructions include: 406—Detecting signal degradation on the first transducer output based on a first transducer stress limit. 408—Detecting signal degradation on the first transducer output based on an amplifier or DAC headroom limit. 410—Increasing a first transducer target resonance frequency for the first transducer output in response to the signal degradation. 412—Reducing the cross-over frequency between the first and second bandwidth portions until a cross-over frequency reaches a minimum cross-over frequency, or until signal degradation on the first transducer output is detected. 414—Increasing the cross-over frequency until signal degradation on the first transducer output is not detected. 416—Reducing a target resonance frequency of the first or second bandwidth portions until the target resonance frequency reaches a minimum target resonance frequency, or until signal degradation on the first transducer output is detected. 418—Increasing the target resonance frequency until signal degradation on the first transducer output is not detected.

Figure 5:
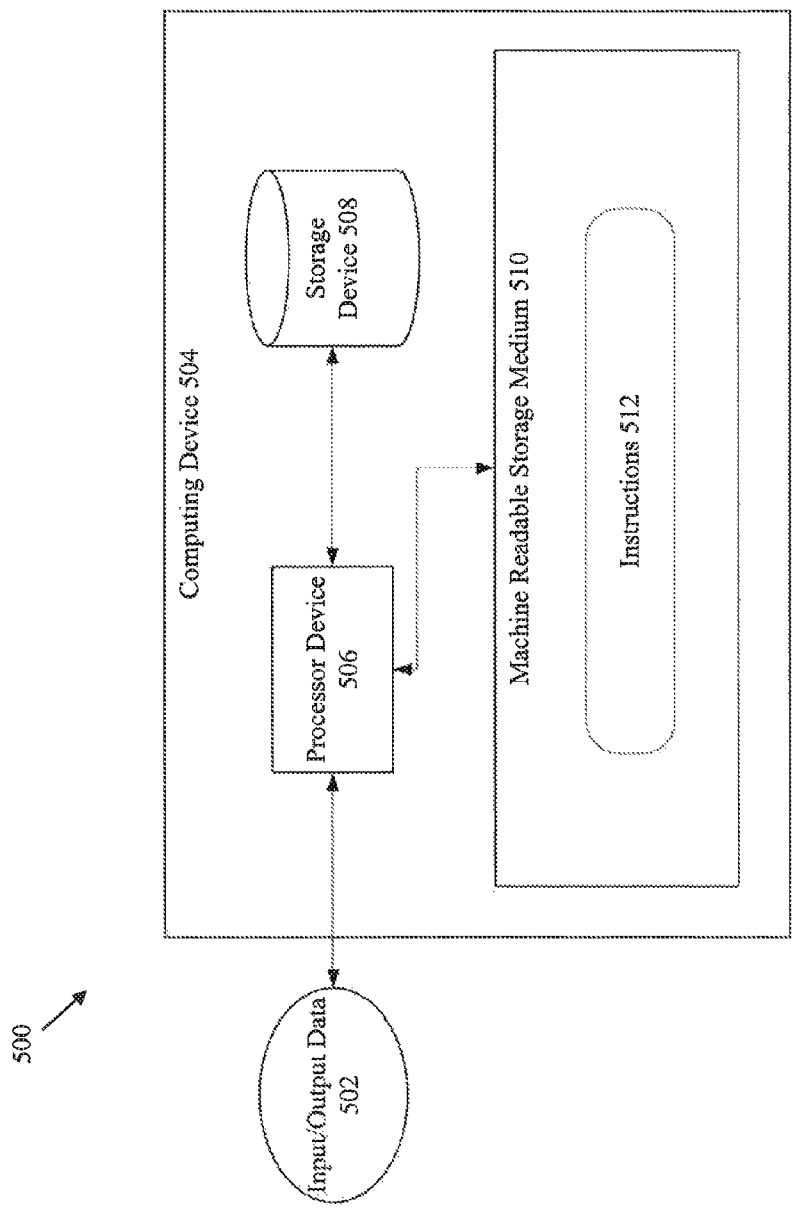
FIG. 5 is a fourth example embodiment of a signal processor.

FIG. 5 is another example system 500 for hosting instructions for enabling a signal processing (e.g. multi-transducer audio) apparatus. The system 500 shows an input/output data 502 interface with an electronic apparatus 504. The electronic apparatus 504 includes a processor 506, a storage device 508, and a machine-readable storage medium 510. The machine-readable storage medium 510 includes instructions 512 which control how the processor 506 receives input data 502 and transforms the input data into output data 502, using data within the storage device 508. Example instructions 512 stored in the machine-readable storage medium 510 are discussed elsewhere in this specification. The machine-readable storage medium in an alternate example embodiment is a computer-readable storage medium.

The processor (such as a central processing unit, CPU, microprocessor, application-specific integrated circuit (ASIC), etc.) controls the overall operation of the storage device (such as random access memory (RAM) for temporary data storage, read only memory (ROM) for permanent data storage, firmware, flash memory, external and internal hard-disk drives, and the like). The processor device communicates with the storage device and non-transient machine-readable storage medium using a bus and performs operations and tasks that implement one or more instructions stored in the machine-readable storage medium. The machine-readable storage medium in an alternate example embodiment is a computer-readable storage medium.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions illustrated herein and data and instructions associated therewith are stored in respective storage devices, which are implemented as one or more non-transient machine or computer-readable or computer-usable storage media or mediums. Such computer-readable or computer-usable storage medium or media is (are) considered to be part of an article (or article of manufacture). An article or article of manufacture can refer to any manufactured single component or multiple components. The non-transient machine or computer-usable media or mediums as defined herein excludes signals, but such media or mediums may be capable of receiving and processing information from signals and/or other transient mediums. The storage media include different forms of memory including semiconductor memory devices such as DRAM, or SRAM, Erasable and Programmable Read-Only Memories (EPROMs), Electrically Erasable and Programmable Read-Only Memories (EEPROMs) and flash memories; magnetic disks such as fixed, floppy and removable disks; other magnetic media including tape; and optical media such as Compact Disks (CDs) or Digital Versatile Disks (DVDs).

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A signal processor, comprises:
a signal input having an input bandwidth;
a first transducer output;
a second transducer output;
a filter network coupled to the signal input, the first transducer output and the second transducer output;
wherein the filter network is configured to output a first portion of the input bandwidth on the first transducer output and a second portion of the input bandwidth on the second transducer output;
a control module coupled to the filter network and configured to adjust the first and second portions of the input bandwidth in response to signal degradation on the first transducer output;
wherein the filter network includes a high-pass filter configured to output the first portion of the input bandwidth and a low-pass filter configured to output the second portion of the input bandwidth;
wherein the first and second portions of the input bandwidth are separated by a cross-over frequency; and
wherein the control module is configured to adjust the cross-over frequency.

2. The processor of claim 1:
wherein signal degradation on the first transducer output is based on a first transducer stress limit.

3. The processor of claim 1:
further comprising an amplifier, having an amplifier limit, coupled to the first transducer output; and
wherein signal degradation on the first transducer output is based on the amplifier limit.

4. The processor of claim 1: further comprising a Digital to Analog Converter (DAC), having a DAC headroom limit, coupled to the first transducer output; and wherein signal degradation on the first transducer output is based on the DAC headroom limit.

5. The processor of claim 1:
wherein the first transducer output is a high audio frequency band speaker output and the second transducer output is a low audio frequency band speaker output; and
wherein the control module is configured to decrease or increase the first portion of the input bandwidth and increase or decrease the second portion of the input bandwidth based on the signal degradation.

6. The processor of claim 1:
further comprising an equalizer configuring a first transducer target resonance frequency for the first transducer output; and
wherein the control module is configured to increase the first target resonance frequency in response to the signal degradation.

7. The processor of claim 6:
wherein the equalizer configures a second transducer target resonance frequency for the second transducer output;
further comprising a second control module coupled to the filter network; and
wherein the second control module is configured to increase the second target resonance frequency in response to the signal degradation on the second transducer output.

8. The processor of claim 1:
wherein the signal processor is included in at least one of: a smartphone, an audio system, an active loudspeaker, a media device, a transportation device, a stereo, a radio or a transducer protection device.

9. The processor of claim 1:
further comprising a first transducer coupled to the first transducer output and a second transducer coupled to the second transducer output; and
wherein the transducers are at least one of: a bandwidth limited device, a main loudspeaker, a subwoofer, a woofer, a tweeter, a piezo speaker.

10. The signal processor of claim 1, further comprising:
a set of N transducer outputs, wherein N is an integer greater than 1;
wherein the signal input is configured to receive a set of channels;
wherein the filter network is coupled to the set of N transducer outputs;
wherein the filter network is configured to apportion the input bandwidth and set of channels between the set of N transducer outputs; and
wherein the control module is configured to adjust the portions apportions in response to signal degradation on a subset of the N transducer outputs.

11. The processor of claim 1:
wherein the signal input is an audio signal input.

12. An article of manufacture comprises at least one non-transitory, tangible machine readable storage medium containing executable machine instructions for signal processing, the instructions comprising:
outputting a first portion of an input bandwidth on a first transducer output and a second portion of the input bandwidth on a second transducer output;
adjusting the first and second portions of the input bandwidth in response to signal degradation on the first or second transducer output;
wherein an interface between the first and second portions of the input bandwidth is a cross-over frequency;
wherein adjusting further includes:
reducing the cross-over frequency until the cross-over frequency reaches a minimum cross-over frequency, or until signal degradation on the first transducer output is detected; and
increasing the cross-over frequency until signal degradation on the first transducer output is not detected;
whereby the cross-over frequency converges to a nominal frequency.

13. The instructions of claim 12, further comprising:
detecting signal degradation on the first or second transducer output based on a first transducer stress limit.

14. The instructions of claim 12, further comprising:
detecting signal degradation on the first or second transducer output based on an amplifier limit.

15. The instructions of claim 12, further comprising:
detecting signal degradation on the first or second transducer output based on a DAC headroom limit.

16. The instructions of claim 12:
increasing a first transducer target resonance frequency for the first transducer output in response to the signal degradation.

17. The instructions of claim 12:
further comprising, adjusting a first transducer output target resonance frequency in response to signal degradation on the first transducer output;
wherein adjusting includes:
reducing the target resonance frequency until the target resonance frequency reaches a minimum target resonance frequency, or until signal degradation on the first transducer output is detected; and
increasing the target resonance frequency until signal degradation on the first transducer output is not detected;
whereby the target resonance frequency converges to a nominal frequency.

18. A method for signal processing, comprising:
outputting a first portion of an input bandwidth on a first transducer output and a second portion of the input bandwidth on a second transducer output;
adjusting the first and second portions of the input bandwidth in response to signal degradation on the first transducer output;
wherein an interface between the first and second portions of the input bandwidth is a cross-over frequency;
wherein adjusting further includes:
reducing the cross-over frequency until the cross-over frequency reaches a minimum cross-over frequency, or until signal degradation on the first transducer output is detected; and
increasing the cross-over frequency until signal degradation on the first transducer output is not detected;
whereby the cross-over frequency converges to a nominal frequency.

* * * * *